(12) United States Patent
Lou et al.

US011209462B1

(10) Patent No.: US 11,209,462 B1
(45) Date of Patent: Dec. 28, 2021

(54) TESTING APPARATUS

(71) Applicant: STAR TECHNOLOGIES, INC., Hsinchu (TW)

(72) Inventors: Choon Leong Lou, Hsinchu (TW); Hsiao Ting Tseng, Hsinchu (TW); Li Min Wang, Hsinchu (TW); Chia Hao Tu, Hsinchu (TW); Chun Wei Peng, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 0 days.

(21) Appl. No.: 16/950,513

(22) Filed: Nov. 17, 2020

(30) Foreign Application Priority Data

Sep. 4, 2020 (CN) .......................... 202010923721.5

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/00* | (2006.01) | |
| *G01R 31/20* | (2006.01) | |

(52) U.S. Cl.
CPC ..... *G01R 1/07342* (2013.01); *G01R 1/07378* (2013.01)

(58) Field of Classification Search
CPC .......... G01R 1/04; G01R 1/067; G01R 1/073; G01R 1/07342; G01R 1/07378; G01R 31/00; G01R 31/02; G01R 31/20; G01R 31/28
See application file for complete search history.

(56) References Cited

U.S. PATENT DOCUMENTS 6,853,205 B1 * 2/2005 Cheng ................ G01R 1/07342
324/755.05
7,014,499 B2 * 3/2006 Yoon .................. G01R 1/07378
324/756.03

* cited by examiner

*Primary Examiner* — Neel D Shah
(74) *Attorney, Agent, or Firm* — Muncy, Geissler, Olds & Lowe, P.C.

(57) ABSTRACT

The present application provides a testing apparatus. The testing apparatus includes a base; a first printed circuit board, disposed above the base; a stiffener, disposed adjacent to the base, located at a center of the base and passing through the first printed circuit board; a second printed circuit board, disposed at a center of the stiffener; and a probe card, one part thereof disposed adjacent to the stiffener and the other part thereof passing through the base, the first printed circuit board, the stiffener and the second printed circuit board. The base, the stiffener and the second printed circuit board are integrated and the base carries the first circuit board.

14 Claims, 6 Drawing Sheets

TESTING APPARATUS

TECHNICAL FIELD

The present disclosure relates to a testing apparatus, and more particularly, to a testing apparatus with a stiffener.

DISCUSSION OF THE BACKGROUND

In general, the electronic properties of the semiconductor devices (such as integrated circuit chips) on the wafer must be tested first to decide if the functions of the integrated circuit chips are good. Good integrated circuit chips are chosen to perform the subsequent package processes, and the NG (not-good) integrated circuit chips are abandoned to avoid increasing additional packaging cost. The integrated circuit chips after packaging must be tested again to select NG ones and further to increase the yield rate of the final products. In other words, the integrated circuit chips must be tested many times during the fabricating processes.

Please refer to FIG. 1, it shows a prior art testing system 10' for testing a device under test 31' (such as semiconductor devices or integrated circuit chips). The testing system 10' includes a shell 11' (defines a testing chamber 13'), a frame 17 disposed in the shell 11', a foundation 30' disposed on the frame 17' and receiving the device under test 31', a head plate 15' (have an opening 19') disposed in the shell 11' and a probe card 40' disposed on the head plate 15'. The device under test 31' is disposed on the foundation 30' having a heater 33'.

The probe card 40' includes a printed circuit board (PCB) 41', a supporting member 45' disposed on the PCB 41' and a plurality of probes 43' fastened on the supporting member 45' with epoxy resin 47'. The PCB 41' has a first surface 42A' and a second surface 42B', and a front end of the probe 43' may be electrically connected to the device under test 31' facing the second surface 42B' of the PCB 41'. A tail end of the probe 43' may be electrically connected to the conductive line 53' disposed on the first surface 42A' of the PCB 42' through the conductive channel 51' disposed inside the PCB 41'.

The foundation 30' is risen to make the front end of the probe 43' be electrically connected to a contact pad 35' of the device under test 31' while testing, and then the probe card 40' is electrically connected to the device under test 31'. During the test, a testing signal is transmitted from the probe 43' of the probe card 40' to the device under test 31' and a response signal of the device under test 31' is transmitted to the outside of the probe card 40' to be analyzed to perform the electrical test of the device under test 31'.

However, since the PCB 41' is directly connected to the probe 43' of the probe card 40' and the PCB 41' is used for bearing, the larger the volume of the PCB 41', the more the variation under different temperatures, and further the connection between the PCB 41' and the probe card 40' is easily affected by the change of the temperature to result in distortion or errors of the test results. In other words, the bigger the change of the temperature of the testing chamber 13', the more the deformation of the PCB 41' and the more the displacement of the tip of the probe 43' to result in the deviating from the contact pad 35' of the device under test 31', and further result in the distortion or error of the test results.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a testing apparatus including a base; a first printed circuit board disposed adjacent to the base; a stiffener disposed adjacent to the base, located at a center of the base and passing through the first printed circuit board; a second printed circuit board disposed at a center of the stiffener; and a probe card, one part thereof is disposed adjacent to the stiffener and the other part thereof is passing through the base, the first printed circuit board, the stiffener and the second printed circuit board.

In some embodiments, the base is substantially rounded and has a first concave portion disposed at a center thereof and used for receiving the stiffener, and a first through hole passes though the center of the first concave portion.

In some embodiments, a second through hole passes through a center of the first printed circuit board and is arranged corresponding to the first through hole.

In some embodiments, the stiffener has a second concave portion disposed at the center thereof and used for receiving the second printed circuit board, and a third through hole passes through a center of the second concave portion.

In some embodiments, a fourth through hole passes through a center of the second printed circuit board, and the fourth through hole, the second through hole and the first through hole are communicated with each other for providing the other part of the probe card to pass through.

In some embodiments, the probe card has a body portion and a plurality of probes, the body portion is disposed adjacent to the stiffener, and the plurality of probes passes through the base, the first printed circuit board, the stiffener and the second printed circuit board and is electrically connected to the second printed circuit board.

In some embodiments, the first through hole of the base is substantially a square with rounded corners.

In some embodiments, a convex portion is protruded downwardly from the center of the stiffener and passes through the first through hole of the base.

In some embodiments, the convex portion has a profile corresponding to a profile of the first through hole of the base.

In some embodiments, a surface of the first printed circuit board has a first circuit pattern, a surface of the second printed circuit board has a second circuit pattern, and the first circuit pattern and the second circuit pattern are electrically connected to each other through bonding wires.

In some embodiments, the probe card has a body portion and a plurality of probes, the body portion is disposed adjacent to the stiffener, the plurality of the probes passes through the first through hole of the base, the second through hole of the first printed circuit board, the third through hole of the stiffener and the fourth through hole of the second printed circuit board and is electrically connected to the second circuit pattern of the second printed circuit board.

In some embodiments, a surface of the base has a first positioning mark, a surface of the stiffener has a third positioning mark, and the third positioning mark is aligned with the first positioning mark of the base while the stiffener is assembled on the base.

In some embodiments, the second printed circuit board has a second positioning mark, and the second positioning mark of the second printed circuit board is aligned with the third positioning mark of the stiffener while the first printed circuit board is disposed adjacent to the base.

In some embodiments, the base, the stiffener and the second printed circuit board are integrally formed.

According to some embodiments of the present disclosure, a testing apparatus is provided. The testing apparatus includes a base, a first printed circuit board, a stiffener, a second printed circuit board and a probe card. The base, the stiffener and the second printed circuit board may be integrally formed. The base may be used for bearing the first printed circuit board. As a result, it may prevent the first printed circuit board and the probes of the probe card from directly connecting and the base bears the first printed circuit board; therefore, while in different temperature, the temperature variations of the materials of the base, the stiffener and the second printed circuit board are proximate to the temperature variation of the probe card, and the probes of the probe card are not directly connected to the first printed circuit board so that the variation between the first printed circuit board and the probes of the probe card is decreased and further to prevent from the distortion or errors of the test results and increase the yield rate.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
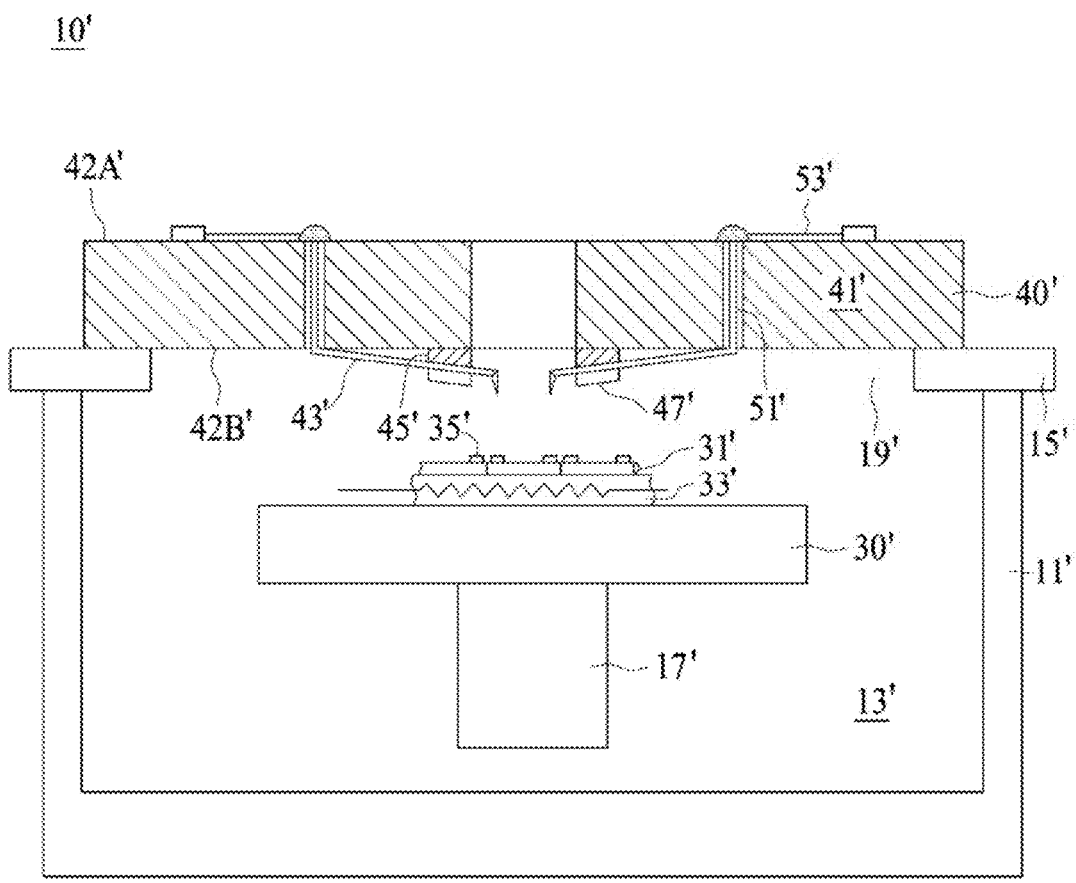
FIG. 1 is a schematic diagram of a prior art testing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, above (or up) corresponds to the direction of the arrow of the direction Z, and below (or down) corresponds to the opposite direction of the arrow of the direction Z.

The test apparatus 100 of the present disclosure may be employed in the test system 10' of FIG. 1; that is, the test apparatus 100 of the present disclosure may displace with the probe card 40'. The test apparatus 100 of the present disclosure will describe in detail later and may be collocated with part of the elements of FIG. 1 for supplementary descriptions if necessary.

Figure 2:
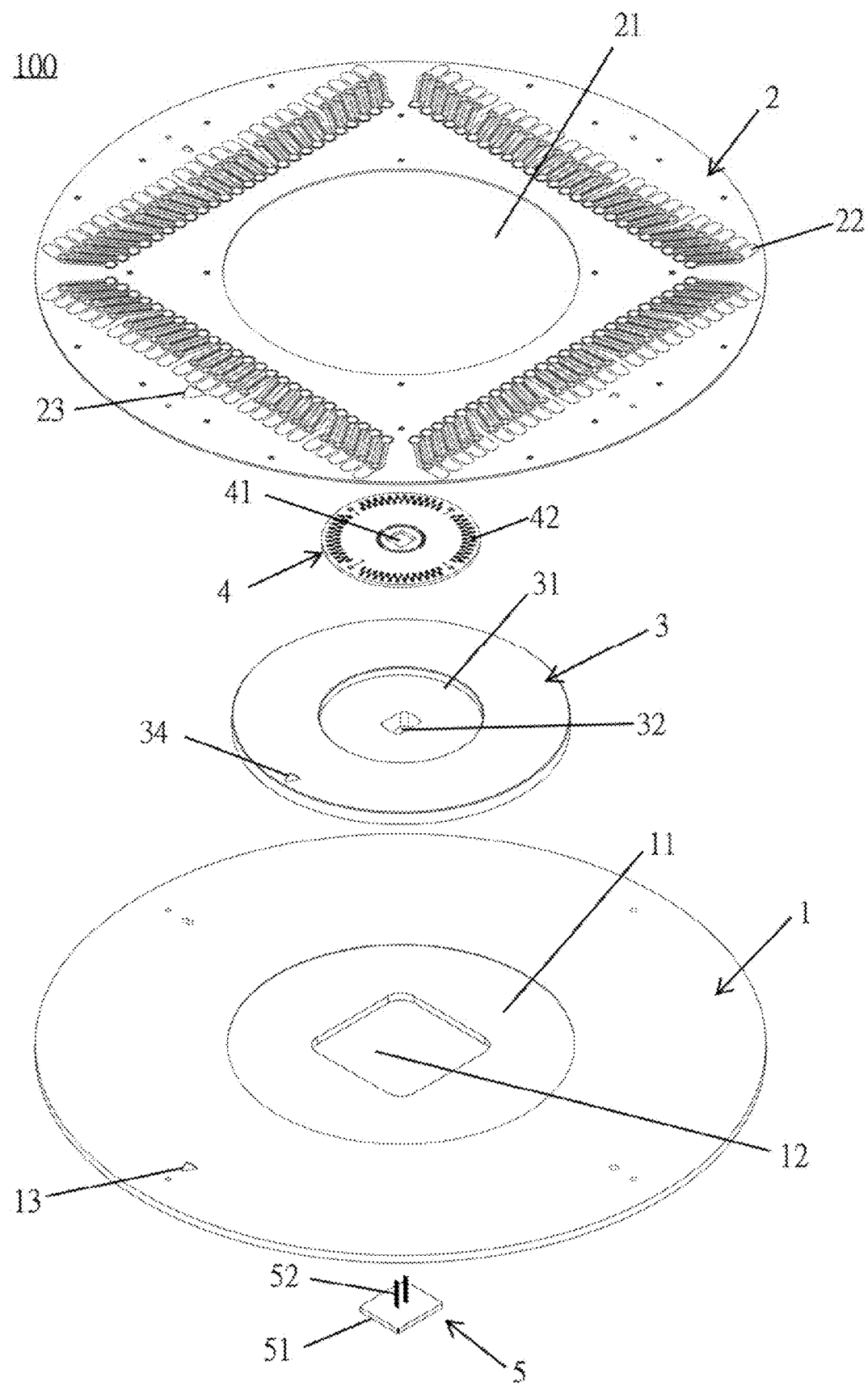
FIG. 2 is an exploded top view of a test apparatus in accordance with one embodiment of the present disclosure.
Figure 3:
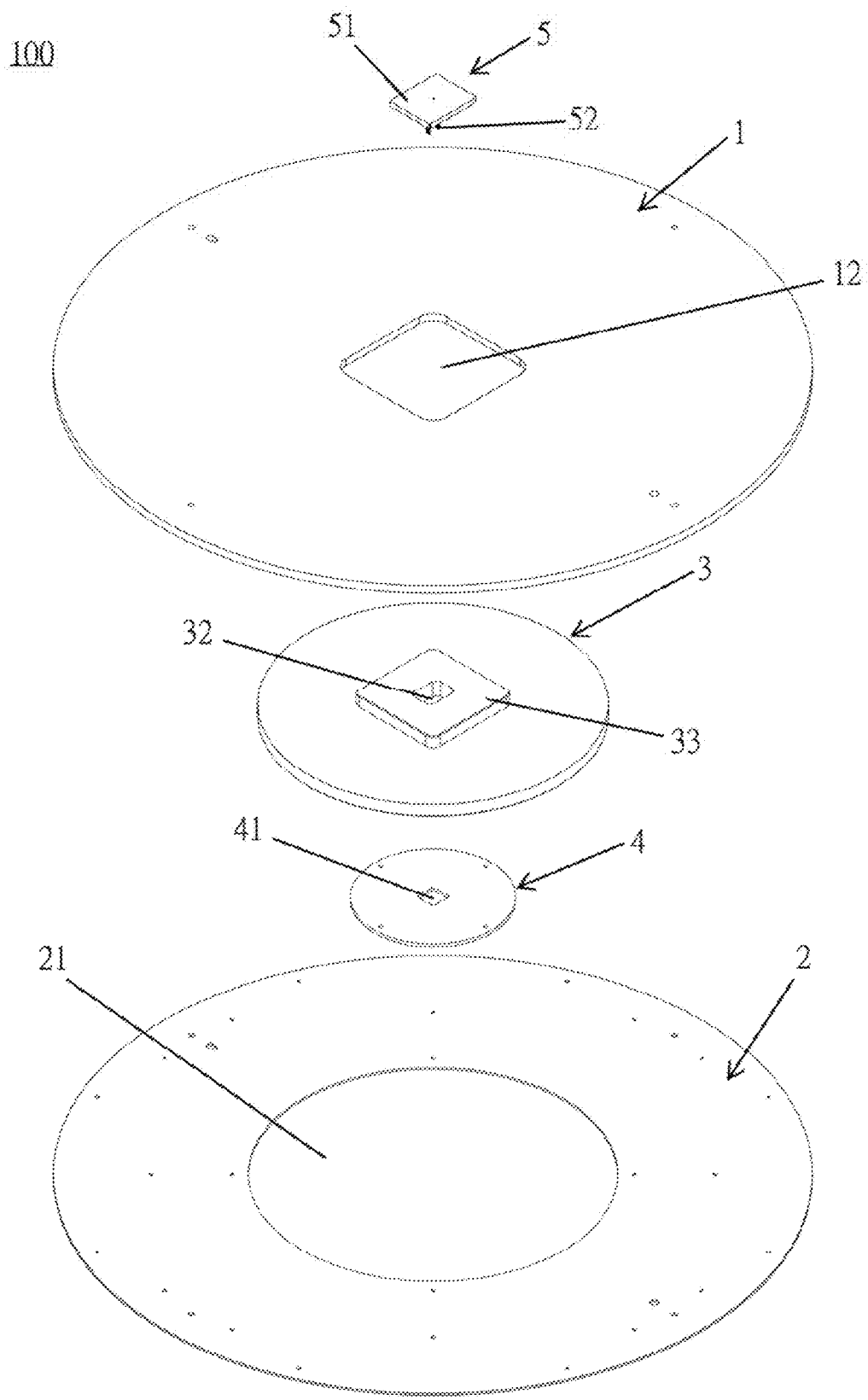
FIG. 3 is an exploded bottom view of the test apparatus in accordance with one embodiment of the present disclosure.
Figure 4:
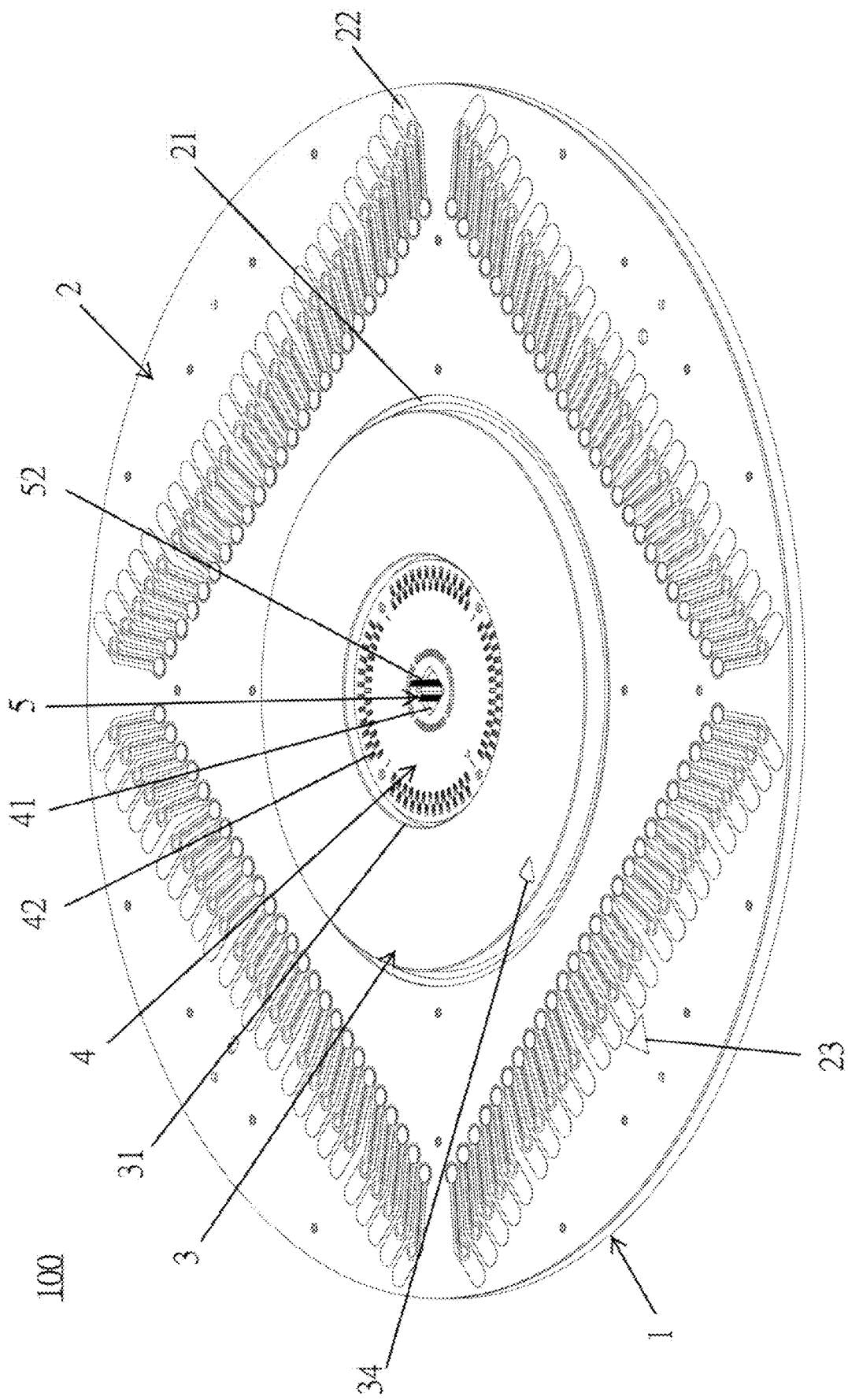
FIG. 4 is a perspective view of the test apparatus in accordance with one embodiment of the present disclosure.
Figure 5:
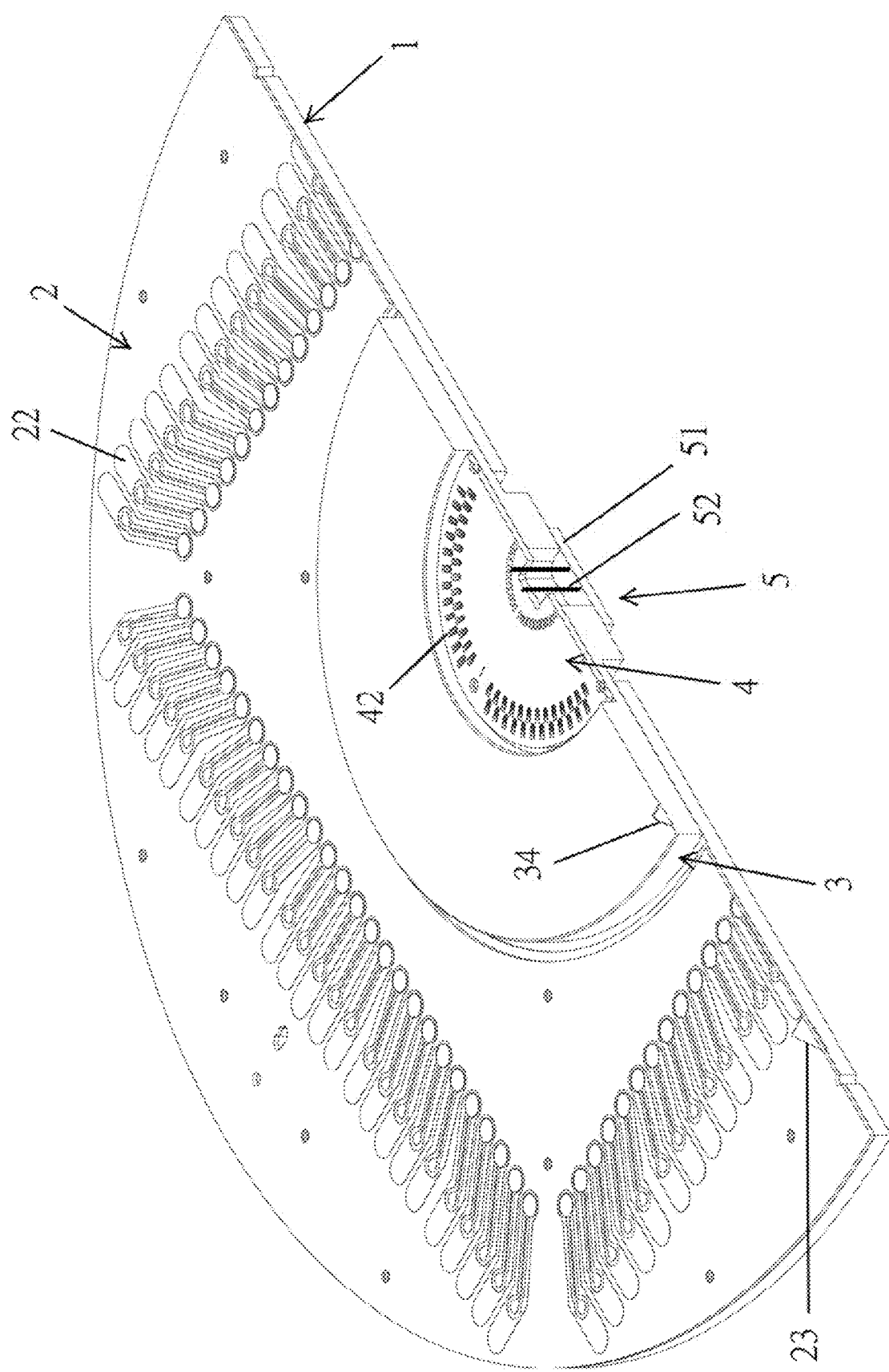
FIG. 5 is a half cross-sectional view of the test apparatus in accordance with one embodiment of the present disclosure.
Figure 6:
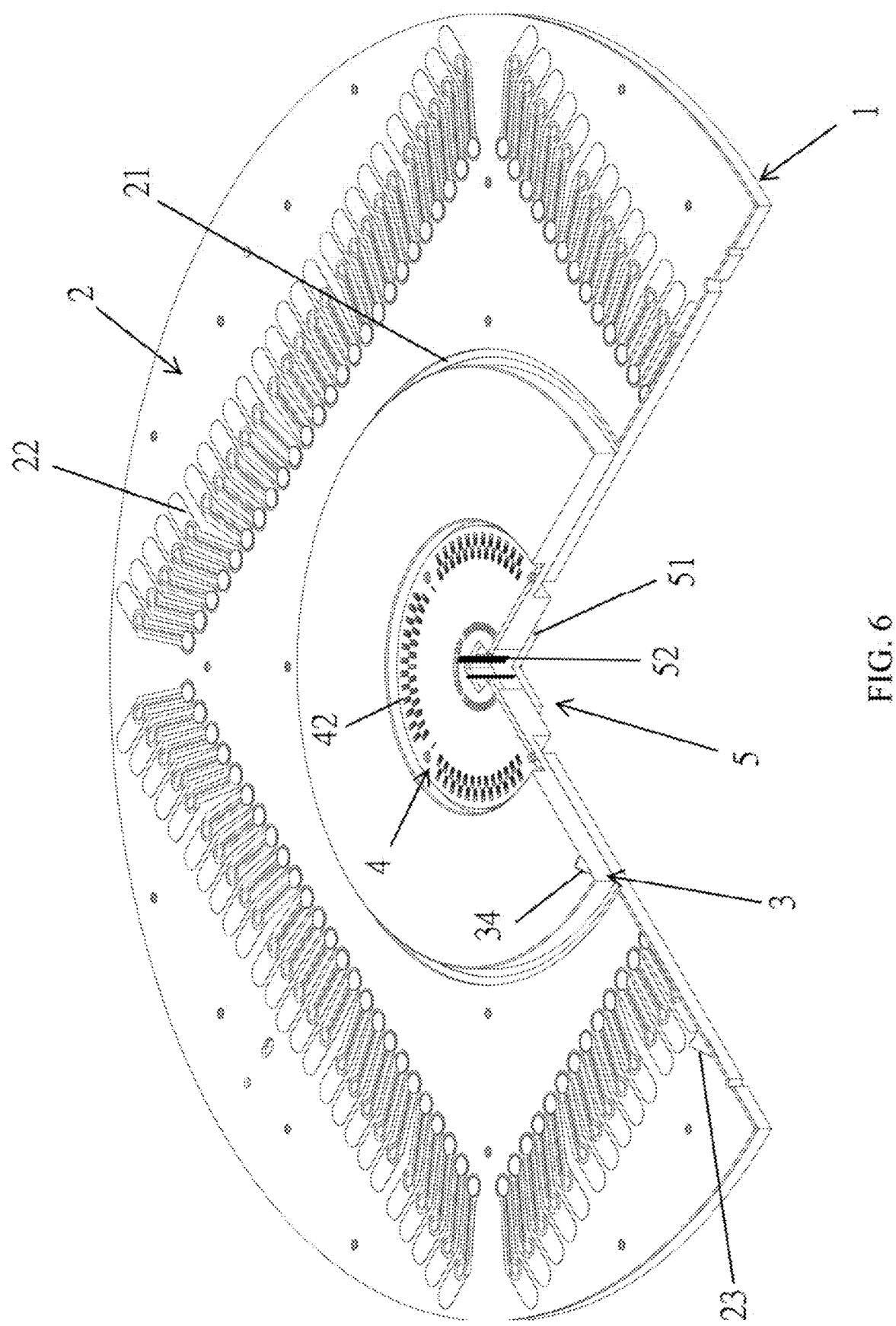
FIG. 6 is a three-quarter cross-sectional view of the test apparatus in accordance with one embodiment of the present disclosure.

FIG. 2 is an exploded top view of a test apparatus in accordance with one embodiment of the present disclosure. FIG. 3 is an exploded bottom view of the test apparatus in accordance with one embodiment of the present disclosure. FIG. 4 is a perspective view of the test apparatus in accordance with one embodiment of the present disclosure. FIG. 5 is a half cross-sectional view of the test apparatus in accordance with one embodiment of the present disclosure. FIG. 6 is a three-quarter cross-sectional view of the test apparatus in accordance with one embodiment of the present disclosure.

Please refer to FIGS. 2 to 6, the test apparatus 100 of the present disclosure includes a base 1, a first printed circuit board 2, a stiffener 3, a second printed circuit board 4 and a probe card 5. The body portion 51 of the probe card 5 is disposed adjacent to the stiffener 3; and a portion of the probe 52 passes through the base 1, the first printed circuit board 2, the stiffener 3 and the second printed circuit board 4.

Please refer to FIGS. 2 and 3, in some embodiments of the present disclosure, the base 1 is substantially rounded and has a first concave portion 11 disposed at a center thereof for providing to receive the stiffener 3. A first through hole 12 passes through a center of the first concave portion 11.

Please refer to FIGS. 2 to 6, the first printed circuit board 2 is disposed adjacent to the base 1. In some embodiments of the present disclosure, a second through hole 21 passes through a center of the first printed circuit board 2 and is disposed corresponding to the first concave portion 11 of the base 1. Please refer to FIG. 2, in some embodiments of the present disclosure, a surface of the first printed circuit board 2 has a first circuit pattern 22.

Please refer to FIGS. 2 to 6, the stiffener 3 is disposed adjacent to the base 1 and located at the center of the base 1 and passes through the first printed circuit board 2. Please refer to FIGS. 2 and 3, in some embodiments of the present disclosure, the stiffener 3 has a second concave portion 31 disposed at the center thereof and used for providing to receive the second printed circuit board 3. A third through hole 32 passes through a center of the second concave portion 31.

Please refer to FIGS. 2 to 6, in some embodiments of the present disclosure, a convex portion 33 is protruded from the center of the stiffener 3 and correspondingly passes through the first through hole 12 of the base 1. In some embodiments of the present disclosure, the first through hole 12 of the base 1 is a square with rounded corners. The convex portion 33 has a profile corresponding to a profile of the first through hole 12 of the base 1; in other words, the profile of the convex portion 33 is a square with rounded corners.

Please refer to FIGS. 2 and 3, in some embodiments of the present disclosure, the second printed circuit board 4 is disposed at the center of the stiffener 3. In some embodiments of the present disclosure, a fourth through hole 41 passes through a center of the second printed circuit board 4. The fourth through hole 41 of the second printed circuit board 4, the third through hole 32 of the stiffener 3, the second through hole 21 of the first printed circuit board 2 and the first through hole 12 of the base 1 are communicated with each other for providing the other part of the probe card 5 to pass through. Please refer to FIGS. 2 and 3 again, in some embodiments of the present disclosure, a surface of the second printed circuit board 4 has a second circuit pattern 42. The first circuit pattern 22 of the first printed circuit board 2 and the second circuit pattern 42 of the second printed circuit board 4 are electrically connected to each other through bonding wires (not shown).

Please refer to FIGS. 2 to 6, in some embodiments of the present disclosure, the probe card 5 has a body portion 51 and a plurality of probes 52. The body portion 51 may include a printed circuit board (not shown) and is disposed adjacent to the stiffener 3. The plurality of the probes 52 passes through the first through hole 12 of the base 1, the second through hole 21 of the first printed circuit board 2, the third through hole 32 of the stiffener 3 and the fourth through hole 41 of the second printed circuit board 4 and electrically connected to the second circuit pattern 42 of the second printed circuit board 4.

Please refer to FIGS. 2 and 4, in some embodiments of the present disclosure, a surface of the base 1 has a first positioning mark 13, such as a triangle mark shown as in FIG. 2, and a surface of the stiffener 3 has a third positioning mark 34, such as a triangle mark shown as in FIG. 2. When the stiffener 3 is assembled on the base 1, the third positioning mark 34 of the stiffener 3 is aligned with the first positioning mark 13 of the base 1. In some embodiments of the present disclosure, the second printed circuit board 2 has a second positioning mark 23, such as a triangle mark shown as in FIG. 2. When the first printed circuit board 2 is disposed adjacent to the base 1, the second positioning mark 23 of the second printed circuit board 2 is aligned with the third positioning mark 34 of the stiffener 23.

In addition, please refer to FIGS. 2 to 6, in some embodiments of the present disclosure, the base 1, the stiffener 3 and the second printed circuit board 4 are integrally formed.

In summary, please refer to FIG. 1 and FIGS. 2 to 6, when testing, the base 1 is risen so that a front end of each of the probes 52 is electrically connected to the connect pad of the device under test and then the probe card 40 and the device under test are electrically connected. During the test, a testing signal is transmitted from the probes 52 of the probe card 50 to the device under test and a response signal of the device under test is transmitted to the outside of the probe card 50 through the probes 52 to be analyzed to perform the electrical test of the device under test.

Due to the above mentioned structure, the test apparatus 100 of the present disclosure includes the base 1, the first printed circuit board 2, the stiffener 3, the second printed circuit board 4 and the probe card 5. The base 1, the stiffener 3 and the second printed circuit board 4 may be integrally formed. The base 1 may be used for bearing the first printed circuit board 2. As a result, it may prevent from the larger the volume of the first printed circuit board 2, the more the variation, and further results in that the connection between the first printed circuit board 2 and the probe card 5 is easily affected by the change of the temperature to result in the distortion or errors of the testing results. In other words, since the change of the temperature of the testing chamber is large, the deformation of the first printed circuit board 2 is large and the displacement of the tip of each of the probes 52 is large, the base 1 directly bears the first printed circuit board 2 so that the first printed circuit board 2 is not directly connected to the probe card 5 to prevent from deviating from the contact pad 35' of the device under test 31', and further result in the distortion or error of the test results. Therefore, while in different temperature, the temperature variations of the materials of the base 1, the stiffener 3 and the second printed circuit board 4 are proximate to the temperature variation of the probe card 5, and the probes 52 of the probe card 5 are not directly connected to the first printed circuit board 2 so that the variation between the first printed circuit board 2 and the probes 52 of the probe card 5 is decreased and further to prevent from the distortion or errors of the test results and increase the yield rate.

In addition, since the first through hole 12 of the base 1 is a square with rounded corners and the profile of the convex portion 33 is corresponding to the profile of the first through hole 12 of the base 1, the profile of the convex portion 33 is a square with rounded corners. Since the surface of the base 1 has the first positioning mark 13, such as the triangle mark shown as in FIG. 2, and the surface of the stiffener 3 has the third positioning mark 34, such as the triangle mark shown as in FIG. 2, the third positioning mark 34 is aligned with the first positioning mark 23 while the stiffener 3 is assembled on the base 1. Since the second printed circuit board 2 has second positioning mark 23, such as the triangle mark shown as in FIG. 2, the second positioning mark 23 of the second printed circuit board 2 is aligned with the third positioning mark 34 of the stiffener 3 while the first printed circuit board 2 is disposed adjacent to the base 1. It may prevent from wrong assembly.

One aspect of the present disclosure provides a testing apparatus including a base; a first printed circuit board disposed adjacent to the base; a stiffener disposed adjacent to the base, located at a center of the base and passing through the first printed circuit board; a second printed circuit board disposed at a center of the stiffener; and a probe card, one part thereof is disposed adjacent to the stiffener and the other part thereof is passing through the base, the first printed circuit board, the stiffener and the second printed circuit board.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A testing apparatus, comprising:
   a base;
   a first printed circuit board disposed adjacent to the base;
   a stiffener disposed adjacent to the base, located at a center of the base and passing through the first printed circuit board;
   a second printed circuit board disposed at a center of the stiffener; and
   a probe card, one part thereof is disposed adjacent to the stiffener and the other part thereof is passing through the base, the first printed circuit board, the stiffener and the second printed circuit board.

2. The testing apparatus of claim 1, wherein the base is substantially rounded and has a first concave portion disposed at a center thereof and used for receiving the stiffener, and a first through hole passes though the center of the first concave portion.

3. The testing apparatus of claim 2, wherein a second through hole passes through a center of the first printed circuit board and is arranged corresponding to the first through hole.

4. The testing apparatus of claim 3, wherein the stiffener has a second concave portion disposed at the center thereof and used for receiving the second printed circuit board, and a third through hole passes through a center of the second concave portion.

5. The testing apparatus of claim 4, wherein a fourth through hole passes through a center of the second printed circuit board, and the fourth through hole, the second through hole and the first through hole are communicated with each other for providing the other part of the probe card to pass through.

6. The testing apparatus of claim 5, wherein the probe card has a body portion and a plurality of probes, the body portion is disposed adjacent to the stiffener, the plurality of the probes passes through the first through hole of the base, the second through hole of the first printed circuit board, the third through hole of the stiffener and the fourth through hole of the second printed circuit board and is electrically connected to the second circuit pattern of the second printed circuit board.

7. The testing apparatus of claim 2, wherein the first through hole of the base is substantially a square with rounded corners.

8. The testing apparatus of claim 2, wherein a convex portion is protruded downwardly from the center of the stiffener and passes through the first through hole of the base.

9. The testing apparatus of claim 8, wherein the convex portion has a profile corresponding to a profile of the first through hole of the base.

10. The testing apparatus of claim 1, wherein the probe card has a body portion and a plurality of probes, the body portion is disposed adjacent to the stiffener, and the plurality of probes passes through the base, the first printed circuit board, the stiffener and the second printed circuit board and is electrically connected to the second printed circuit board.

11. The testing apparatus of claim 1, wherein a surface of the first printed circuit board has a first circuit pattern, a surface of the second printed circuit board has a second circuit pattern, and the first circuit pattern and the second circuit pattern are electrically connected to each other through bonding wires.

12. The testing apparatus of claim 1, wherein a surface of the base has a first positioning mark, a surface of the stiffener has a third positioning mark, and the third positioning mark is aligned with the first positioning mark of the base while the stiffener is assembled on the base.

13. The testing apparatus of claim 12, wherein the second printed circuit board has a second positioning mark, and the second positioning mark of the second printed circuit board is aligned with the third positioning mark of the stiffener while the first printed circuit board is disposed adjacent to the base.

14. The testing apparatus of claim 1, wherein the base, the stiffener and the second printed circuit board are integrally formed.

* * * * *